(12) United States Patent
Charpentier et al.

(10) Patent No.: US 11,551,323 B2
(45) Date of Patent: Jan. 10, 2023

(54) ENSURING SAFE SERVICING IN A LOW-VOLTAGE NETWORK OF THE ELECTRIC POWER DISTRIBUTION SYSTEM

(71) Applicant: ELECTRICITE DE FRANCE, Paris (FR)

(72) Inventors: Philippe Charpentier, Bullion (FR); Camille Mevel, Antony (FR)

(73) Assignee: ELECTRICITE DE FRANCE, Paris (FR)

( * ) Notice: Subject to any disclaimer, the term of this patent is extended or adjusted under 35 U.S.C. 154(b) by 118 days.

(21) Appl. No.: 16/668,317

(22) Filed: Oct. 30, 2019

(65) Prior Publication Data
US 2020/0134761 A1 Apr. 30, 2020

(30) Foreign Application Priority Data

Oct. 31, 2018 (FR) ...................................... 18 71345

(51) Int. Cl.
G06Q 50/26 (2012.01)
G06F 16/903 (2019.01)
G01R 19/25 (2006.01)
G06N 3/08 (2006.01)
H02J 3/38 (2006.01)
H02J 13/00 (2006.01)

(52) U.S. Cl.
CPC ....... *G06Q 50/265* (2013.01); *G01R 19/2513* (2013.01); *G06F 16/90335* (2019.01); *G06N 3/08* (2013.01); *H02J 3/383* (2013.01); *H02J 13/0013* (2013.01); *H02J 2203/20* (2020.01)

(58) Field of Classification Search
None
See application file for complete search history.

(56) References Cited

U.S. PATENT DOCUMENTS

2016/0072287 A1* 3/2016 Jia .......................... G05B 15/02
                                                    700/295
2017/0076304 A1* 3/2017 Toth ....................... G06Q 50/06

OTHER PUBLICATIONS

French Search Report, dated Jul. 18, 2019, from corresponding French application No. 1871345.
(Continued)

*Primary Examiner* — Mohammad Ali
*Assistant Examiner* — Saad M Kabir
(74) *Attorney, Agent, or Firm* — Nixon & Vanderhye

(57) ABSTRACT

To ensure safety of people needing to service a low-voltage network of an electric power distribution system, dwellings being connected to this network may include autonomous units for producing electricity, thus generating voltage and endangering the people servicing the work. Data are obtained from consumption records from the meter of each dwelling, in regular time intervals, and meteorological data are also obtained in the geographical area of these dwellings, in order to identify at least some weather conditions conducive to the production of energy by autonomous units. A model is then applied for detecting, based on the first and second data, a coincidence between periods of lower consumption measured by a meter and weather conditions conducive to electricity production by autonomous units during these periods. Therefore, information on the presence of autonomous units in the dwelling can be deduced and given to people before their servicing.

13 Claims, 4 Drawing Sheets

(56) References Cited

OTHER PUBLICATIONS

SéQuélec; Prévention du risque électrique lors d'opérations sur les ouvrages en basse tension du « Réseau Public de Distribution » (RPD); Oct. 1, 2015; https://www.enedis.fr/sites/default/files/Guide_SeQuelec_Ndeg14_Prevention_du_risque_electrique_151027.pdf; the reference is cited as an "A" reference in the French search report.

\* cited by examiner

ENSURING SAFE SERVICING IN A LOW-VOLTAGE NETWORK OF THE ELECTRIC POWER DISTRIBUTION SYSTEM

The present invention relates to ensuring the safety of people needing to service a low-voltage network of an electric power distribution system.

During such servicing (routine or following an incident), the electric current must be cut off so that the servicing personnel can work safely. However, with the development of autonomous means of producing renewable electric energy (photovoltaic panels, wind turbines, or other) by individuals, it is possible that the distribution system is still supplied power by these autonomous means even after the low-voltage substation has been shut down by the distribution system operator. When the autonomous means are deployed directly by an individual (and not by the company operating the system) and the individual does not declare the presence of these autonomous means to the system operator, it is possible for an inverter, for example, not to receive power from the distribution system but directly from a photovoltaic panel or a wind turbine. In the event of a power outage, the inverter's role is normally to stop generation from the panel provided that the inverter is properly connected to the main low-voltage network. If not or in the absence of an inverter, the panel or panels continue to generate and thus supply power to the low-voltage network of the neighborhood.

As a result, those working on the network are in danger if they do not check the network voltage. If a non-zero voltage is detected on the network even though the power station and the declared photovoltaic installations have been shut down, the maintenance technicians must search the neighborhood door-to-door for all undeclared self-producing installations in order to disable them. Apart from the danger to the technicians, one can see that this approach is long and tedious, while the users connected to the low-voltage substation are left without electricity.

The present invention improves this situation.

To this end, it proposes a method for ensuring the safety of persons needing to service a low-voltage network of an electric power distribution system, wherein the low-voltage network is typically connected to a substation supplying power to a plurality of dwellings within a geographical area. The dwellings are equipped with meters configured to measure and communicate consumption by regular time intervals (daily or half-hours typically).

As at least some of the dwellings are likely to comprise autonomous means of producing electricity using renewable energy, placing these autonomous means in operation can generate voltage in the low-voltage network despite shutting down the substation during the work, endangering the people performing the work.

The method, implemented by a server communicating with said meters, then comprises the steps of:
obtaining first data from consumption records from each meter by regular time intervals,
obtaining second data which are meteorological data in the geographical area, in order to identify at least some weather conditions conducive to the production of energy by said autonomous means,
for each meter, applying a model for detecting, based on at least the first and second data, a coincidence between periods of lower consumption measured by the meter and weather conditions conducive to electricity production by said autonomous means during said periods, and deducing, from the application of the model, information on the presence of autonomous means in the dwelling equipped with this meter,
for each dwelling, storing in a database the information on the presence of autonomous means, with a corresponding identifier specific to the dwelling,
and, before performing the servicing work, identifying in the database the dwellings likely to comprise autonomous means.

Above, the term "dwelling" is understood to mean a residence, an office, or a factory.

"Renewable energy" is understood to mean solar energy and/or wind energy, which are directly dependent on the aforementioned weather conditions (or even hydraulic energy from streams whose flow depends on rainfall, and therefore once again on weather conditions).

By implementing the invention, not only are the dwellings identified that are equipped with autonomous production means (therefore "self-producers"), but also those that consume their own self-produced energy (dwellings called "self-consumers" below) and which then supply the LV network, which could endanger those performing servicing work.

In one embodiment, the server can further obtain an instantaneous measurement of the voltage in the low-voltage network, typically before the servicing work. The work can thus be dependent on the server obtaining a zero-voltage measurement in the low-voltage network.

In such an embodiment, as each meter can be configured to be cut off remotely, typically by a command from the server, said presence information may be in the form of a probability score for the presence of autonomous means in the dwelling equipped with such a meter, and the method may further comprise the steps of:
establishing a list of the probability scores for the presence of autonomous means, with respective corresponding meter identifiers,
if a non-zero voltage is measured in the low-voltage network, using the meter identifier having the maximum score in said list to cut off that meter remotely, then removing that meter from the list and repeating this step until a zero-voltage measurement is obtained in the network.

According to a first embodiment, the detection model is obtained by a technique called "tree boosting", comprising:
a setting of variables in a learning sample composed of dwellings for which the consumption is analyzed,
a defining of explanatory variables of the correlation, taken from the variables set, and
an application of the tree boosting method to the explanatory variables in order to determine a model for calculating a probability score for the presence of autonomous means in a dwelling equipped with a meter measuring and communicating consumption in the dwelling by regular time intervals, said score corresponding to said presence information stored in the database.

It will therefore be understood that this score calculation model, once this score quantifies the probability of the presence of autonomous means, can ultimately correspond to the aforementioned detection model.

In this embodiment, a cross-validation may further be applied in order to consolidate the determination of the calculation model.

According to a second embodiment, the detection model is obtained by implementing a convolutional neural network, this implementation comprising the following:

a setting of variables in a learning sample composed of dwellings for which the consumption is analyzed, a learning of the sample by the neural network, and the determination by the neural network of a model for calculating a probability score for the presence of autonomous means in a dwelling equipped with a meter measuring and communicating consumption in the dwelling by regular time intervals, this score then corresponding to said presence information stored in the database.

In the first or second embodiment, it is possible to take common variables to be set in the learning sample, these variables possibly being, for each dwelling, among:

the predictive variable, therefore indicating whether or not the dwelling is equipped with autonomous production means;

the dwelling consumption, by regular intervals;

the weather conditions in the area of the dwelling, including an instantaneous temperature in the area.

For example, if the autonomous production means whose presence is to be detected is a photovoltaic panel, then the weather conditions may include at least the level of sunlight (or "irradiance" or "radiation" hereinafter) at a given moment.

Thus, in the case where each meter can further measure and communicate consumption at an hourly or sub-hourly interval, the explanatory variables may comprise at least one variable among:

an average ratio per meter between a consumption between 10 a.m. and 4 p.m. in a day and a total consumption over the same full day, a slope of the regression line of the consumption between 12 p.m. and 2 p.m. versus level of sunlight, a ratio between an average consumption over all meters between 10 a.m. and 4 p.m. for the X days with higher levels of sunlight and that between 10 a.m. and 4 p.m. for the X days with lower levels of sunlight, an average ratio per meter between the consumption between 10 a.m. and 4 p.m. and the degrees of temperature for the same day between 10 a.m. and 4 p.m., an average ratio of consumption per degree of temperature between 10 a.m. and 4 p.m. for the X days with higher levels of sunlight and consumption per degree of temperature between 10 a.m. and 4 p.m. for the X days with lower levels of sunlight.

In the case where each meter can instead measure and communicate consumption at a daily interval, the explanatory variables may comprise at least one variable among:

a ratio of consumption over one day to level of sunlight over the same day;

a ratio of consumption over one day to average level of sunlight between 10 a.m. and 4 p.m. of that day;

a ratio of consumption over one day to average level of sunlight between 12 p.m. and 2 p.m. of that day;

a ratio of consumption over one day to maximum level of sunlight between 10 a.m. and 4 p.m. of that day;

a ratio of consumption over one day to maximum level of sunlight between 12 p.m. and 2 p.m. of that day;

a ratio between the average daily consumption for the X days with higher levels of sunlight and the average consumption for the X days with lower levels of sunlight;

an average ratio of consumption per day per degrees of temperature;

an average ratio between consumption per day per degree of temperature for the X days with higher levels of sunlight and consumption per day per degree of temperature for the X days with lower levels of sunlight.

The present invention further provides a computer program comprising instructions for implementing the above method, when these instructions are executed by a processor of a processing module. It also relates to a non-transitory computer medium for storing the instructions of such a computer program.

It also relates to a server for implementing the above method, and comprising a memory (denoted MEM in FIG. 1) for storing the database and a processing module (denoted MOD in FIG. 1) configured for applying the model for detecting autonomous production means in a dwelling, based on at least the first data on consumption from the meter of this dwelling and on the second data on weather conditions for the area of the dwelling.

This processing module (MOD, detailed in FIG. 4) may be in the form of an electronic circuit with an input IN (typically a communication interface) for receiving the first data (CONS) and the second data (METEO), a memory CIP for storing the code of the computer program instructions within the meaning of the invention, a processor PROC (as mentioned above) for working with this memory CIP, reading the stored code of the instructions, and executing the computer program in order to apply the detection model and, from there, provide the information concerning the presence of autonomous means (via the output OUT of the module MOD) for a dwelling, thus adding data to the database stored in the memory MEM of the server.

The module MOD and the database MEM can be grouped together at the same server SER (as shown in FIG. 1) or located at several different computing entities communicating via a network.

The present invention therefore also provides a processing module of a server within the meaning of the invention, as presented above by way of example.

BRIEF DESCRIPTION OF THE DRAWINGS

Other features and advantages of the invention will be apparent from reading the following detailed description of some exemplary embodiments and from examining the appended drawings in which.

DESCRIPTION OF THE EMBODIMENTS

In the description presented here, the desire is to detect a local presence of autonomous means of energy production (such as one or more photovoltaic modules and/or one or more wind turbines).

Energy self-production is thus identified, and especially the existence of current or voltage despite power being cut off in a section of the low-voltage network.

Autonomous means of energy production are not always declared to the maintenance crews of the low-voltage network, which can endanger these crews as explained above.

The solution proposed by the invention is to detect undeclared self-producers using:

electric power consumption data over a given period (for example a load curve with an interval corresponding to a day or to 30 minutes), and from there, identifying periods of under-consumption compared to average consumption, by obtaining data from the communicating meters of a low-voltage network of the distribution system where the proposed work is to take place, and meteorological data from the nearest weather station in order to identify, for periods of under-consumption, whether the weather conditions were conducive to self-production (for example high irradiance or strong wind), in which case means of autonomous production of electricity are identified (respectively one or more photovoltaic panels or one or more wind turbines) in the premises where said communicating meters are installed.

By coupling the two data sources (load curve data and meteorological data), it is then possible to observe that the consumption of some users, who for example own photovoltaic panels, is below normal when the irradiance is high and normal when the irradiance is low.

From this observation, an identification of relevant variables illustrating this phenomenon is proposed below in the present description, then a modeling which allows calculating a probability score defining whether or not the customer is a self-consumer (consumes the electricity produced from his or her autonomous production means).

In the event of servicing, if the technicians are likely to encounter a non-zero voltage even though the substation of the low-voltage network LV is shut down, it is therefore sufficient to pull the history of the meters and to apply the model derived from the abovementioned processing to determine which dwellings are potentially self-consuming.

Figure 1:
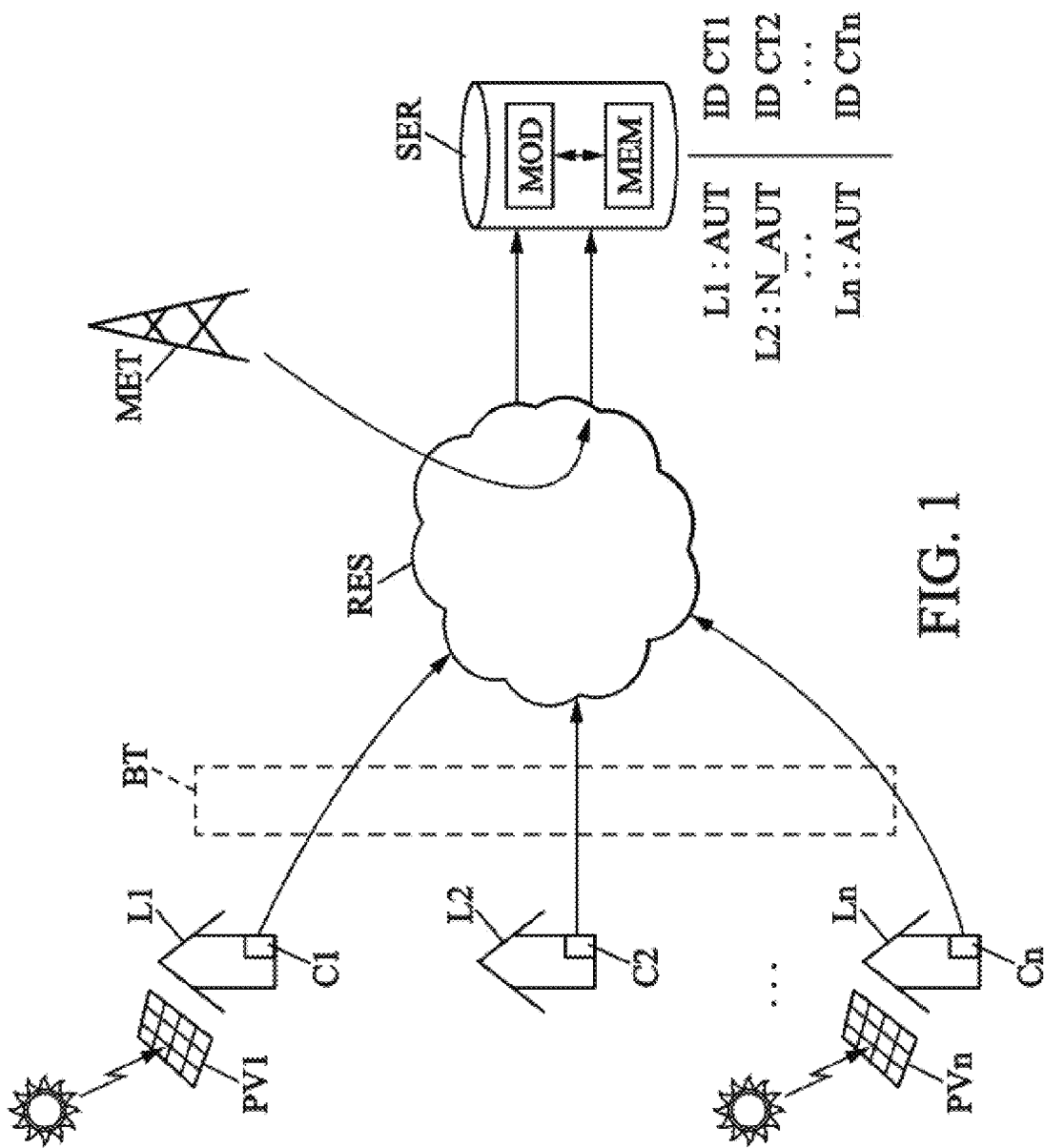
FIG. 1 illustrates an exemplary system for implementing the invention.

As illustrated in FIG. 1, the dwellings L1, L2, ..., Ln in an area powered by a low-voltage network LV are equipped with communicating meters C1, C2, ..., On, capable of communicating with a server SER via a network RES (for example by powerline communication). The server SER also receives meteorological data from the weather station MET. As further illustrated in FIG. 1, some dwellings (here L1 and Ln) are equipped with autonomous production means such as photovoltaic panels (PV1, ..., PVn). As for the server SER, it comprises a processing module MOD whose functionalities are presented below, working with a memory MEM organized as a database in order to store data from the module MOD, these data typically being:

information concerning the presence (AUT) or non-presence (N-AUT) of autonomous means for each dwelling, this presence detected by the module MOD as detailed below, with corresponding contact information for this dwelling (ID CT1, ID CT2, ..., ID CTn).

This contact information may be for example:
telephone numbers, and/or
a digital address (e-mail or other type of messaging), and/or
a physical mailing address.

Once the processing has been performed by the module MOD, the memory MEM can then be accessed in order to determine, before an operation on an area containing the dwellings L1, L2, ..., Ln:

whether certain dwellings are equipped with autonomous production means, and where appropriate, initiate sending a message to said contact information, to notify of future servicing in the area of these dwellings, and asking the users of autonomous production means to shut them off for the duration of the servicing.

In a variant where the servicing personnel can cut off the autonomous production means themselves, the memory MEM stores physical address information for each dwelling, with corresponding information concerning the presence of autonomous means. The memory MEM can then be accessed in order to determine, before an operation in an area containing the dwellings L1, L2, ..., Ln:

whether certain dwellings are equipped with autonomous production means, and where appropriate, initiate sending a message to the servicing personnel, warning of the presence of such autonomous means in some dwellings (L1, ..., Ln) for which the address is specified in the message.

The list of dwellings equipped with autonomous means can thus be transmitted to the technicians responsible for the servicing work, who are thus able to target their search. This approach avoids wasting time inspecting each home served by the LV substation in question in order to find which dwelling is isolated from the network.

In yet another variant, a remote cut-off of communicating meters C1, ..., Cn can be carried out in descending order of probability of their being installed in a dwelling with undeclared self-consumption, as long as the voltage measured in the network is non-zero. In this case, the memory MEM stores a database with meter identifiers (ID C1, ID C2, ..., ID Cn) with corresponding information on the presence or absence of an autonomous means, or a probability score for the presence of an autonomous means in each dwelling L1, L2, ..., Ln.

Indeed, in the case of scheduled servicing in the network, or in portions having power in the case of an outage, it is possible to shut off the meters remotely by lowering the cut-off power of the meters. Thus, the meters of dwellings having a probability above a certain threshold p of being an undeclared self-consumer can be cut off in advance. During the shutoff it is still possible for there to be a non-zero measured voltage, and it is possible to decide to restore power to the substation in order to cut off additional meters.

In general, the data stored in the database MEM which corresponds to the information concerning autonomous production means can thus be:
contact information for a user of the dwelling,
a physical address of the dwelling,
or an identifier of the meter present in the dwelling.

This data is more generally referred to as a "dwelling-specific identifier" (specific to the user of the dwelling, to its meter, to the dwelling itself, and/or other).

Figure 2:
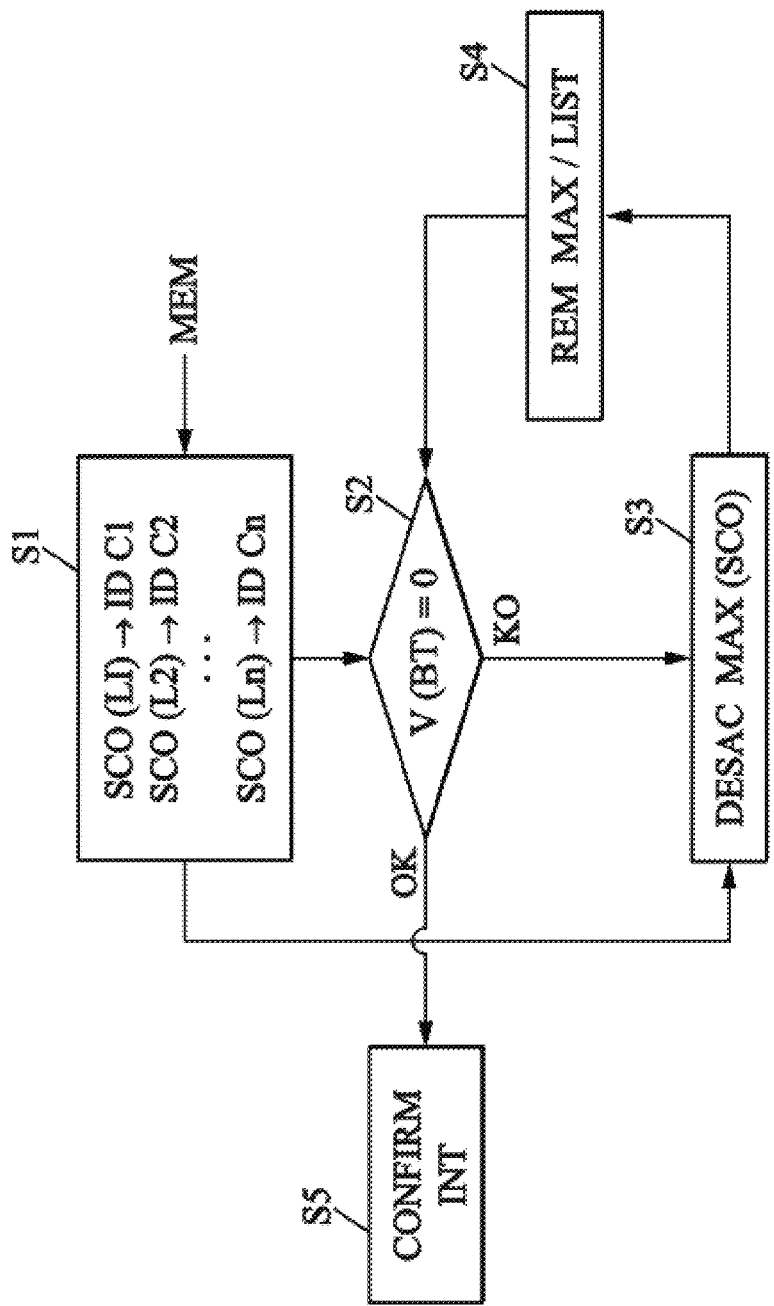
FIG. 2 illustrates an exemplary method within the meaning of the invention, according to one particular embodiment.

FIG. 2 illustrates an example of a succession of steps in a method in which the meters are cut off remotely. In this embodiment, in step S1, a list of probability scores for the presence of autonomous means in respective dwellings equipped with respective counters having identifiers ID C1, ID C2, ..., ID Cn is pulled from the memory MEM. In step S2 (which can be carried out repetitively), the voltage is measured in the LV network in which the servicing is planned. If the voltage is zero (or its absolute value is below a threshold) a message can be issued in step S5, sent to the maintenance team to confirm the servicing. However, if the voltage is not zero (arrow KO exiting test S2), then the meter corresponding to the maximum score MAX(SCO) in the list from the database MEM is cut off in step S3. This maximum score MAX(SCO) is removed from the list for a new iteration, where it checks again whether the voltage in the LV network is zero. Steps S2, S3 and S4 are thus repeated until the measured voltage is zero.

This method (automated by computer means such as a processing circuit provided in the server SER and equipped with a processor) saves time in the servicing and ensures the safety of those working on the network.

The operation of the learning-prediction module MOD, thus populated with consumption data from the meters C1, C2, . . . Cn and with data from the weather station MET for the geographical area of the dwellings L1, . . . , Ln, is described below. The module predicts a probability of self-consumption in each dwelling of the LV network as follows.

Two approaches can be considered for this purpose:
- a first approach called "tree boosting" requiring a construction of variables (or "feature engineering"),
- a second approach based on deep learning.

To implement the model according to the first approach, a learning sample is provided composed of dwellings with the following variables set:
- the predictive variable indicating whether or not the dwelling is self-consuming;
- the consumption (half-hourly or hourly or daily over several days) of the dwelling;
- the irradiance and/or wind strength given by the nearest weather station;
- the temperature given by the nearest weather station, in order to identify consumption related to heat (heating or air conditioning).

Explanatory variables are then constructed from the variables listed above in order to discriminate the phenomenon to be observed, these variables being for example:
- The average ratio per customer between consumption between 10 a.m. and 4 p.m. and total consumption of the day (a potential self-producing individual has a ratio lower than a non-producing individual),
- If one wishes to detect the presence of photovoltaic panels, the slope of the regression line of the consumption between 12 p.m. and 2 p.m. versus the radiation is again an explanatory variable. Indeed, the higher the radiation, the lower the level of consumption (more production).
- The ratio between the average consumption between 10 a.m. and 4 p.m. for the X days with higher radiation and that between 10 a.m. and 4 p.m. for the X days with lower radiation. X is dependent on the available history.
- The average ratio per customer between the consumption between 10 a.m. and 4 p.m. and the degree days between 10 a.m. and 4 p.m.
- The average ratio of consumption per degree days between 10 a.m. and 4 p.m. for the X days with higher radiation and consumption per degree days between 10 a.m. and 4 p.m. for the X days with lower radiation.

In the case where only daily consumptions are available, the created variables may be the following:
- The ratio of daily consumption to daily radiation;
- The ratio of daily consumption to average radiation between 10 a.m. and 4 p.m.;
- The ratio of daily radiation to average radiation between 12 p.m. and 2 pm;
- The ratio of daily consumption to maximum radiation between 10 a.m. and 4 p.m.;
- The ratio of daily consumption to maximum radiation between 12 p.m. and 12 p.m.;
- the ratio between the average daily consumption for the X days with higher radiation levels and the ratio for the X days with lower radiation levels;
- The average daily consumption ratio per degree days;
- The average ratio of daily consumption per degree days for the X days with higher radiation and the daily consumption per degree days for the X days with lower radiation.

These variables have been defined because they minimized prediction errors during tests performed by the Applicant.

Once the explanatory variables are obtained, the model according to the "tree boosting" method can be estimated to analyze whether or not there is self-consumption.

The "tree boosting" can be written mathematically in the following manner based on a first model of the following type:

$$y_t = M_1(x_t) + \varepsilon_{1,t} \quad [\text{Math. 1}]$$

where $y_t$ is the predictive variable and $M_1$ is a regression tree, the difference $\varepsilon_{1,t}$ being the error resulting from the model.

The principle of "tree boosting" consists firstly of estimating the error resulting from the above model, using the formula:

$$\varepsilon_{1,t} = y_t - \hat{M}_1(x_t) \quad [\text{Math. 2}]$$

In a second step, we attempt to model the error estimated above, by a second tree:

$$\hat{\varepsilon}_{1,t} = M_2(x_t) + \varepsilon_{2,t} \quad [\text{Math. 3}]$$

We continue in this manner to model the errors of successive models until a selected stop criterion is satisfied.

At the end, the prediction is obtained as follows:

$$\hat{y}_t = \hat{M}_1(x_t) + \overline{M}_2(x) + \ldots + \hat{M}_k(x_t) \quad [\text{Math. 4}]$$

where k is the number of trees learned.

The estimation of the model according to the "tree boosting" method can then be continued by refining parameters such as the number of trees, the maximum depth of the trees, the percentage used of the learning sample, etc. To estimate these parameters, cross-validations can be performed. A cross-validation consists of dividing the sample into L parts. For each part L, the model is trained on the L−1 other parts, then tested on part L. The L learning and L validations of the model are thus performed until it is possible to estimate the generalization error of the model with this set of parameters. Lastly, the set of parameters minimizing the error in cross-validation is selected.

Once the model has been learned, the module MOD can apply the model by pulling the history available in the communicating meters and the meteorological data. In particular, a probability score for the presence of a photovoltaic panel for example is calculated as a function of the variables giving a low consumption between 10 a.m. and 4 p.m. and more particularly between 12 p.m. and 2 p.m., for sunny days.

The second approach, deep learning, can begin by forming a learning sample possibly using the same variables as those used in the above "tree boosting" method (daily consumption, average daily irradiance, maximum irradiance of the day, average irradiance 12 p.m.-4 p.m. and degree days, for example). Instead of using a fully connected network as is usual to solve this kind of problem, here we use the principle of convolutional networks in order to detect shapes in the load curves taken from the meters and the local temperature, as well as correlations.

For example, the history of each customer can be divided into seven-day periods in order to artificially increase the amount of data, as the weight convergence of neural networks requires a lot of data.

The first layer of the network consists of a convolutional layer consisting of applying n filters to each observation (consisting of the vector of the seven days of consumption of a customer of the sample). The applied filters are of depth 4 (for four variables as inputs: temperature, irradiance between 12 p.m. and 4 p.m. here, irradiance of the day, consumption of the day) and of size 1*1.

After each filter, the activation function is a ReLU function:

$$f(x) = \begin{matrix} x \text{ si } x > 0 \\ 0 \text{ si } x \leq 0 \end{matrix} \qquad [\text{Math. 5}]$$

The values of the filters, also called the weights, are learned by the convolutional network according to the "back propagation" algorithm of the gradient. The weights are then normalized by the Adam method.

After the first convolution step, a Max Pooling step of size 7 is applied. Therefore only one value per input variable remains, per observation and per filter.

Figure 3:
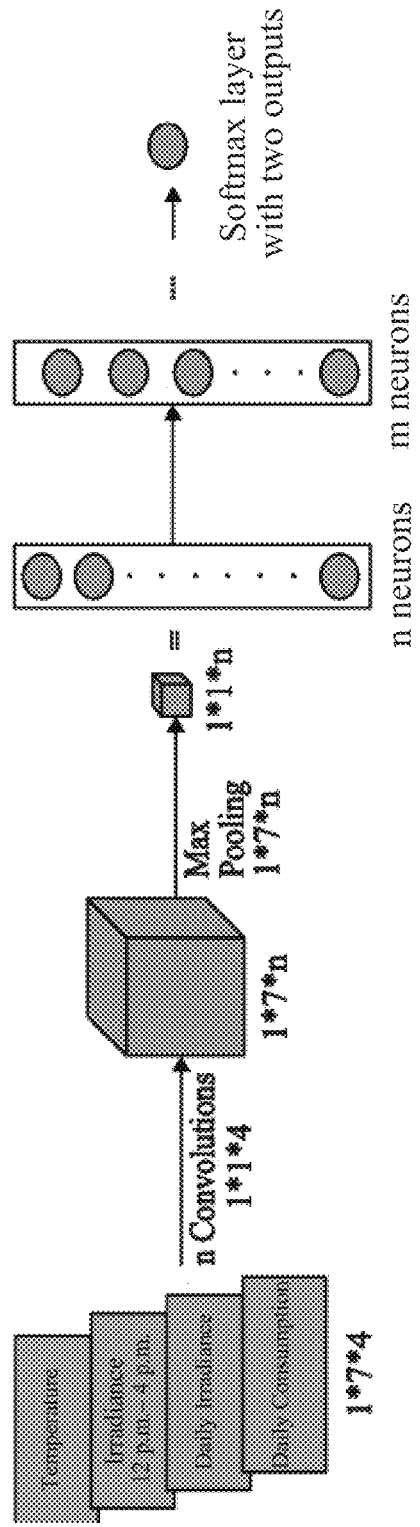
FIG. 3 illustrates an approach to constructing a prediction model by deep learning, the use of the model yielding the list of dwellings where the presence of an autonomous means of production is probable.
Figure 4:
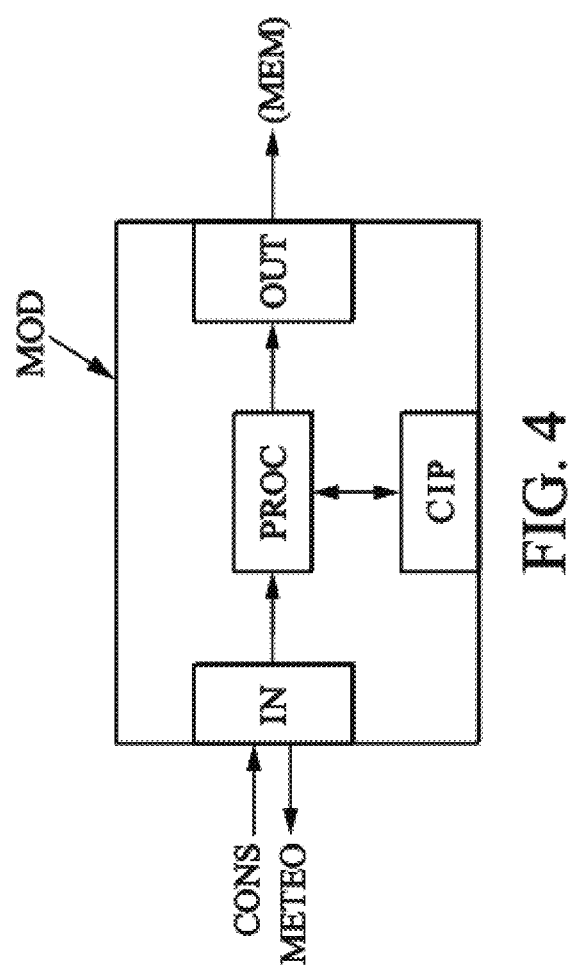
FIG. 4 schematically illustrates a processing module of a server within the meaning of the invention.

The Pooling outputs are then connected to a network having the general architecture illustrated in FIG. 3. The network is fully connected with a number of hidden layers which varies according to the data. The network terminates in a Softmax layer in order to discriminate between undeclared self-consumers and other customers (two outputs for example).

Of course, the present invention is not limited to the embodiments presented above by way of example; it extends to other variants.

For example, another problem that the invention could solve relates to backfeeding in LV networks when solar production exceeds consumption at the scale of a LV substation, as too large of an imbalance can lead to shutting off power in the network. In the case of significant backfeeding in the network, solutions are currently being tested such as installing batteries in the network. However, these are still global solutions (introducing batteries at the network level for example) and are often expensive and not targeted to the few customers who are generating the backfeeding. Identifying undeclared self-producers would make it possible to better adapt the solutions to be applied: for example, to offer specific storage solutions (domestic hot water tank, battery, or other), to shift their usage, to sell their energy to other customers, or propose islanding in case of too much backfeeding in the network.

The invention thus makes it possible to automatically detect undeclared self-consumers in a network in order to:
  ensure safety when technicians are performing servicing work,
  reduce servicing times,
  and possibly ensure network safety in case of excessive backfeeding from undeclared self-consumers.

The invention claimed is:

1. A method for ensuring the safety of persons needing to service a low-voltage network of an electric power distribution system, wherein:
  the low-voltage network is connected to a substation supplying power to a plurality of dwellings within a geographical area,
  the dwellings are equipped with meters configured to measure and communicate consumption by regular time intervals,
  at least some of the dwellings comprising autonomous means of producing electricity using renewable energy,
  a placing in operation of said autonomous means generating voltage in the low-voltage network despite shutting down the substation during the work, thus endangering people during their servicing,
  the method, implemented by a server communicating with the meters, comprising:
    obtaining first data from consumption records from each meter by regular time intervals,
    obtaining second data which are meteorological data in the geographical area, in order to identify at least some weather conditions conducive to the production of energy by said autonomous means,
    for each meter, applying a model for detecting, based on at least the first and second data, a coincidence between periods of low consumption measured by the meter and weather conditions conducive to electricity production by said autonomous means during said periods, and deducing, from the application of the model, information on the presence of autonomous means in the dwelling equipped with this meter,
    for each dwelling, storing in a database the information on the presence of autonomous means, with a corresponding identifier specific to the dwelling,
    and, before performing the servicing work, ensuring the safety of the persons needing to service the low-voltage network of the electric power distribution system by identifying in the database whether the dwellings comprise or do not comprise autonomous means according to said information.

2. The method according to claim 1, wherein the server further obtains an instantaneous measurement of the voltage in the low-voltage network before the servicing work, and the work is dependent on the server obtaining a zero-voltage measurement in the low-voltage network.

3. The method according to claim 2, wherein each meter is configured to be cut off remotely by a command from the server, and wherein the presence information is a probability score for the presence of autonomous means in the dwelling equipped with said meter, and the method further comprises:
    establishing a list of the probability scores for the presence of autonomous means, with respective corresponding meter identifiers,
    if a non-zero voltage is measured in the low-voltage network, using the meter identifier having the maximum score in said list to cut off that meter remotely, then removing that meter from the list and using again a next meter identifier having a new maximum score in said list to cut off that next meter until a zero-voltage measurement is obtained in the network.

4. The method according to claim 1, wherein the detection model is obtained by a "tree boosting" technique comprising:
    a setting of variables in a learning sample composed of dwellings for which the consumption is analyzed,
    a defining of explanatory variables, taken from the variables set, and
    an application of the tree boosting method to the explanatory variables in order to determine a model for calculating a probability score for the presence of autonomous means in a dwelling equipped with a meter measuring and communicating consumption in the dwelling by regular time intervals, said score corresponding to said presence information stored in the database.

5. The method according to claim 4, wherein a cross-validation is further applied in order to consolidate the determination of the calculation model.

6. The method according to claim 1, wherein the detection model is obtained by implementing a convolutional neural network, this implementation comprising:
- a setting of variables in a learning sample composed of dwellings for which the consumption is analyzed,
- a learning of the sample by the neural network, and
- the determination by the neural network of a model for calculating a probability score for the presence of autonomous means in a dwelling equipped with a meter measuring and communicating consumption in the dwelling by regular time intervals, said score corresponding to said presence information stored in the database.

7. The method according to claim 4, wherein the variables to be set in the learning sample comprise, for each dwelling:
- a predictive variable indicating whether or not the dwelling is equipped with autonomous production means;
- the dwelling consumption, by regular intervals;
- the weather conditions in the area of the dwelling, including an instantaneous temperature in this area.

8. The method according to claim 1, wherein the autonomous production means whose presence is to be detected is a photovoltaic panel, and wherein the weather conditions include at least the level of sunlight at a given moment.

9. The method according to claim 7, wherein the autonomous production means whose presence is to be detected is a photovoltaic panel, and the weather conditions include at least the level of sunlight at a given moment, and wherein each meter is arranged to measure and communicate consumption at an hourly or sub-hourly interval, said explanatory variables comprising at least one variable among:
- an average ratio per meter between a consumption between 10 a.m. and 4 p.m. in a day and a total consumption over the same full day,
- a slope of the regression line of the consumption between 12 p.m. and 2 p.m. versus level of sunlight,
- a ratio between an average consumption over all meters between 10 a.m. and 4 p.m. for the X days with X highest levels of sunlight and that between 10 a.m. and 4 p.m. for the X days with X lowest levels of sunlight,
- an average ratio per meter between the consumption between 10 a.m. and 4 p.m. and the degrees of temperature for the same day between 10 a.m. and 4 p.m.,
- an average ratio of consumption per degree of temperature between 10 a.m. and 4 p.m. for the X days with the X highest levels of sunlight and consumption per degree of temperature between 10 a.m. and 4 p.m. for the X days with the X lowest levels of sunlight.

10. The method according to claim 7, wherein the autonomous production means whose presence is to be detected is a photovoltaic panel, and wherein the weather conditions include at least the level of sunlight at a given moment, and wherein each meter is arranged to measure and communicate consumption at a daily interval, the explanatory variables comprising at least one variable among:
- a ratio of consumption over one day to level of sunlight over the same day;
- a ratio of consumption over one day to average level of sunlight between 10 a.m. and 4 p.m. of that day;
- a ratio of consumption over one day to average level of sunlight between 12 p.m. and 2 p.m. of that day;
- a ratio of consumption over one day to maximum level of sunlight between 10 a.m. and 4 p.m. of that day;
- a ratio of consumption over one day to maximum level of sunlight between 12 p.m. and 2 p.m. of that day;
- a ratio between the average daily consumption for the X days with X highest levels of sunlight and the average consumption for the X days with X lowest levels of sunlight;
- an average ratio of consumption per day per degrees of temperature;
- an average ratio between consumption per day per degree of temperature for the X days with the X highest levels of sunlight and consumption per day per degree of temperature for the X days with the X lowest levels of sunlight.

11. A non-transitory computer storage medium, storing instructions of a computer program causing, when said instructions are executed by a processor of a processing circuit, the implementation of a method for ensuring the safety of persons needing to service a low-voltage network of an electric power distribution system, the low-voltage network being connected to a substation supplying power to a plurality of dwellings within a geographical area, the dwellings being equipped with meters configured to measure and communicate consumption by regular time intervals, at least some of the dwellings comprising autonomous means of producing electricity using renewable energy, a placing in operation of said autonomous means generating voltage in the low-voltage network despite shutting down the substation during the work, thus endangering people during their servicing,
- the method, implemented by a server communicating with the meters, comprising:
  - obtaining first data from consumption records from each meter by regular time intervals,
  - obtaining second data which are meteorological data in the geographical area, in order to identify at least some weather conditions conducive to the production of energy by said autonomous means,
  - for each meter, applying a model for detecting, based on at least the first and second data, a coincidence between periods of low consumption measured by the meter and weather conditions conducive to electricity production by said autonomous means during said periods, and deducing, from the application of the model, information on the presence of autonomous means in the dwelling equipped with this meter,
  - for each dwelling, storing in a database the information on the presence of autonomous means, with a corresponding identifier specific to the dwelling,
  - and, before performing the servicing work, ensuring the safety of the persons needing to service the low-voltage network of the electric power distribution system by identifying in the database whether the dwellings comprise or do not comprise autonomous means according to said information.

12. A server for implementing a method for ensuring the safety of persons needing to service a low-voltage network of an electric power distribution system, the low-voltage network being connected to a substation supplying power to a plurality of dwellings within a geographical area, the dwellings being equipped with meters configured to measure and communicate consumption by regular time intervals, at least some of the dwellings comprising autonomous means of producing electricity using renewable energy, a placing in operation of said autonomous means generating voltage in the low-voltage network despite shutting down the substation during the work, thus endangering people during their servicing, said method being implemented by the server communicating with the meters, and comprising:

obtaining first data from consumption records from each meter by regular time intervals, obtaining second data which are meteorological data in the geographical area, in order to identify at least some weather conditions conducive to the production of energy by said autonomous means, for each meter, applying a model for detecting, based on at least the first and second data, a coincidence between periods of low consumption measured by the meter and weather conditions conducive to electricity production by said autonomous means during said periods, and deducing, from the application of the model, information on the presence of autonomous means in the dwelling equipped with this meter, for each dwelling, storing in a database the information on the presence of autonomous means, with a corresponding identifier specific to the dwelling, and, before performing the servicing work, ensuring the safety of the persons needing to service the low-voltage network of the electric power distribution system by identifying in the database whether the dwellings comprise or do not comprise autonomous means according to said information, the server comprising a memory for storing the database and a processing circuit configured for applying the model for detecting autonomous production means in a dwelling, based on at least the first data on consumption from the meter of that dwelling and on the second data on weather conditions for the area of the dwelling.

13. A processing circuit of a server according to claim 12, comprising a memory for storing the database and a processing circuit configured for applying the model for detecting autonomous production means in a dwelling, based on at least the first data on consumption from the meter of that dwelling and on the second data on weather conditions for the area of the dwelling.

* * * * *